(12) United States Patent
Yi

(10) Patent No.: US 7,812,895 B2
(45) Date of Patent: Oct. 12, 2010

(54) THIN FILM TRANSISTOR (TFT) ARRAY PANEL WITH TFTS HAVING VARYING LEAKAGE CURRENTS

(75) Inventor: Chung Yi, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 498 days.

(21) Appl. No.: 11/274,994

(22) Filed: Nov. 16, 2005

(65) Prior Publication Data

US 2006/0152644 A1     Jul. 13, 2006

(30) Foreign Application Priority Data

Jan. 7, 2005 (KR) .................... 10-2005-0001609

(51) Int. Cl.
G02F 1/136 (2006.01)
H01L 31/00 (2006.01)
H01L 27/14 (2006.01)

(52) U.S. Cl. .................... 349/46; 349/42; 349/43; 257/59; 257/72

(58) Field of Classification Search .................... 349/46, 349/145, 42, 43; 257/59, 72
See application file for complete search history.

(56) References Cited

U.S. PATENT DOCUMENTS 5,146,356 A * 9/1992 Carlson .................... 349/38
6,456,013 B1 * 9/2002 Komiya et al. ........... 315/169.1
6,671,010 B2 * 12/2003 Kwon et al. ................ 349/43

FOREIGN PATENT DOCUMENTS

CN           1551690       12/2004
WO    WO 2004042781 A2 *  5/2004

* cited by examiner

*Primary Examiner*—Michael H Caley
(74) *Attorney, Agent, or Firm*—F. Chau & Associates, LLC

(57) ABSTRACT

A thin film transistor (TFT) array panel is provided, which includes a substrate, a plurality of gate lines including gate electrodes, a plurality of data lines intersecting the gate lines; a plurality of TFTs having semiconductors, connected to the gate lines and the data lines, and a plurality of pixel electrodes connected to the TFTs, wherein the TFTs have varying leakage currents, and the TFTs are randomly distributed.

12 Claims, 11 Drawing Sheets

THIN FILM TRANSISTOR (TFT) ARRAY PANEL WITH TFTS HAVING VARYING LEAKAGE CURRENTS

CROSS-REFERENCE TO RELATED APPLICATION

This application claims priority from Korean Patent Application No. 10-2005-0001609 filed on Jan. 7, 2005, in the Korean Intellectual Property Office, the disclosure of which is incorporated by reference herein in its entirety.

BACKGROUND OF THE INVENTION

1. Field of the Invention

The present invention relates to a thin film transistor array panel using polysilicon as a semiconductor.

2. Description of Related Art

A thin film transistor (TFT) array panel is used as a circuit substrate to individually drive each pixel in a flat panel display having a plurality of pixels such as a liquid crystal display or an organic light emitting diode display.

The liquid crystal display (LCD) includes two panels provided with field-generating electrodes such as pixel electrodes and a common electrode, and a liquid crystal (LC) layer interposed therebetween. The LCD displays images by applying voltages to the field-generating electrodes to generate an electric field in the LC layer, which determines orientations of LC molecules in the LC layer to adjust polarization of incident light.

The organic light emitting diode display (OLED) is a self emissive display device, which displays images by exciting an emissive organic material to emit light. The OLED includes an anode (hole injection electrode), a cathode (electron injection electrode), and an organic light emission layer interposed therebetween. When the holes and the electrons are injected into the light emission layer, they are recombined and pair annihilated with emitting light.

Each pixel of the OLED includes two transistors such as a drive transistor, typically a TFT, and a switching transistor, typically a TFT. The current for light emission is driven by the drive TFT and the amount of current driven by the drive TFT is controlled by the data signals from the switching TFT.

Typically, the TFT array panel includes a semiconductor made of amorphous silicon or crystalline silicon. Amorphous silicon is widely used in displays having glass with a low melting point, since amorphous silicon film can be fabricated at low temperatures.

However, the amorphous silicon film has low carrier mobility. It may be unsuitable for applying to a high quality drive circuit of display panels. Whereas, since polycrystalline silicon has good electric field effect mobility, then in high frequency operation, and with low leakage current, high quality drive circuits, polycrystalline silicon is more desirable.

The electrical characteristics of the TFT array panel using polycrystalline silicon are influenced by the size and the uniformity of the grain. That is, the electric field effect mobility of the TFT array panel is increased according to the increased size and uniformity of the grain. The method of forming the polycrystalline silicon with increasing the size and the uniformity of grain is of concern.

Excimer laser annealing (ELA) and chamber annealing are typical methods for producing polycrystalline silicon. Recently, a sequential lateral solidification (SLS) process deriving lateral growth of the silicon crystalline has been proposed.

The SLS technique utilizes a phenomenon where the silicon grains grow laterally to the boundary of a liquid region and a solid region. In the SLS process, the size of the grains can be as much as the predetermined widths by controlling the irradiation range and the energy of a laser beam using an optic system and a mask selectively passing the laser beam.

The ELA technique utilizes an excimer laser as a source and a sequential shifting of irradiation region to crystallize the amorphous silicon into the polycrystalline silicon. In the ELA, the laser irradiation is sequentially executed, and the portion of the irradiation region is overlapped by aligning the irradiation region of the excimer laser. Accordingly, the excimer laser is repeatedly irradiated on the predetermined region.

After sequential lateral solidification, protrusions are formed on the surface of the polysilicon layer along the grain boundaries due to the grains growing toward each other. These methods reduce the flow of current, and result in degrading the characteristics of the TFTs, thereby causing defects such as horizontal stripes or vertical stripes.

Furthermore, the difference in the shifting pitch and the beam width are generated after excimer laser annealing, and the number of irradiation cycles is changed depend on the positions of the semiconductor. As a result, the crystallized state of the semiconductor causes the stripe defect.

SUMMARY OF THE INVENTION

The present invention provides a thin film transistor array panel with uniform display quality without an influence of the crystallized state.

A thin film transistor (TFT) array panel is provided, which includes a substrate, a plurality of gate lines including gate electrodes, a plurality of data lines intersecting the gate lines, a plurality of TFTs having semiconductor islands, connected to the gate lines and the data lines;, and a plurality of pixel electrodes connected to the TFTs, wherein the TFTs have varying leakage currents, and the TFTs are randomly distributed.

The semiconductor islands and the gate electrodes may overlap each other with varying overlapping areas to form the varying leakage currents.

The semiconductor islands and the gate electrodes may overlap each other with varying declinations to form varying leakage currents. The semiconductor islands and the gate electrodes may also overlap each other with varying overlapping areas to form varying leakage currents. The TFT array panel may further include a blocking layer formed between the substrate and the semiconductor islands.

The TFT array panel may further include a passivation layer formed between the pixel electrodes and the gate and data lines.

The TFT array panel may further include an interlayer insulating layer formed between the gate lines and the data lines.

The TFT array panel may further include a partition formed on the pixel electrodes, and a plurality of light emitting members formed on the pixel electrodes and disposed in openings defined by the partition.

BRIEF DESCRIPTION OF THE DRAWINGS

The present invention will become more apparent by describing embodiments thereof in detail with reference to the accompanying drawings, in which.

DETAILED DESCRIPTION OF PREFERRED EMBODIMENTS

Figure 1:
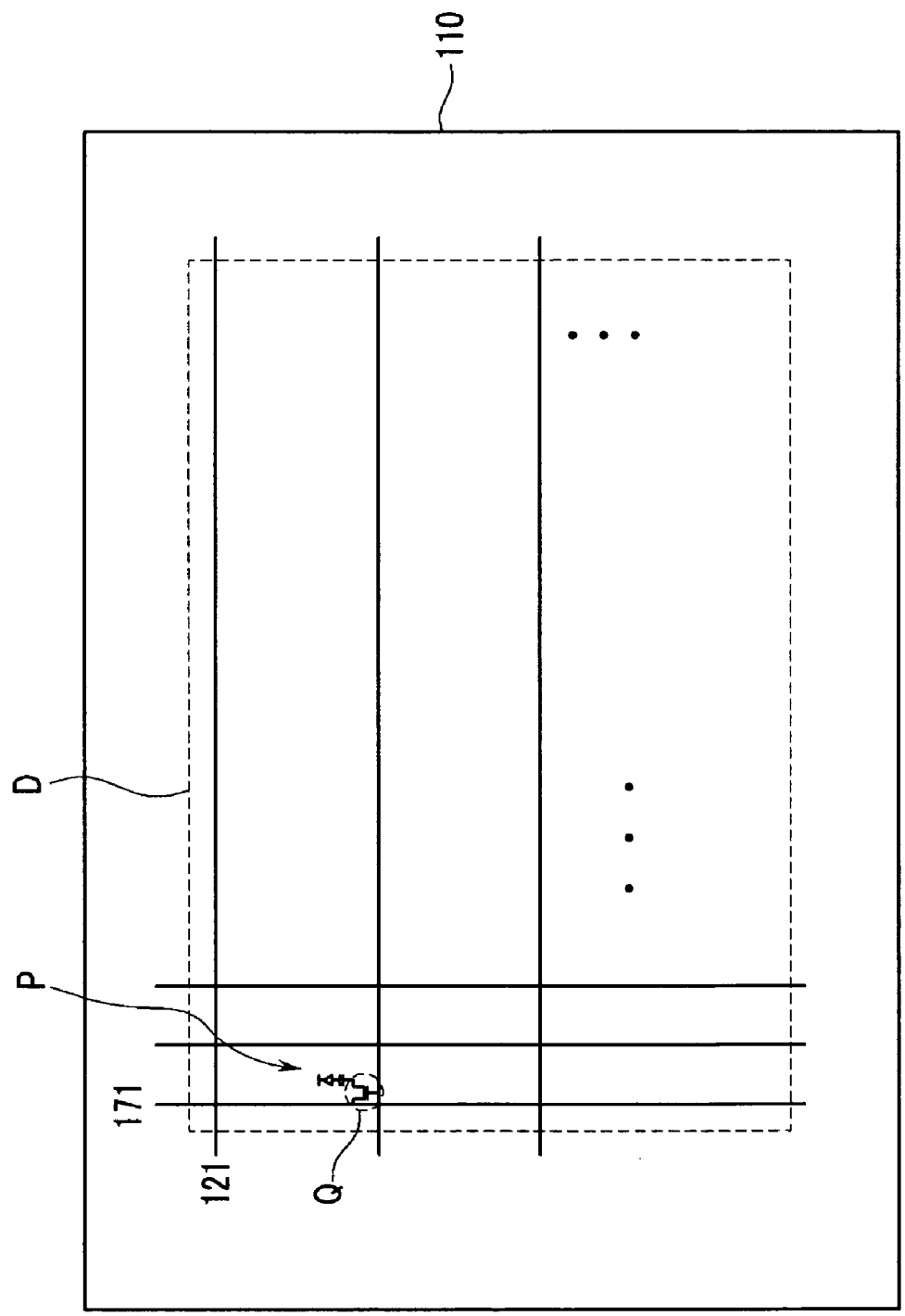
FIG. 1 shows a liquid crystal display (LCD) according to an embodiment of the present invention.

The present invention now will be described more fully with reference to the accompanying drawings, in which preferred embodiments of the invention are shown. This invention may, however, be embodied in many different forms and should not be construed as limited to the embodiments set forth herein.

In the drawings, the thickness of layers and regions are exaggerated for clarity. Like numerals refer to like elements throughout. It will be understood that when an element such as a layer, region, or substrate is referred to as being "on" another element, it can be directly on the other element or intervening elements may also be present. In contrast, when an element is referred to as being "directly on" another element, there are no intervening elements present.

Figure 2:
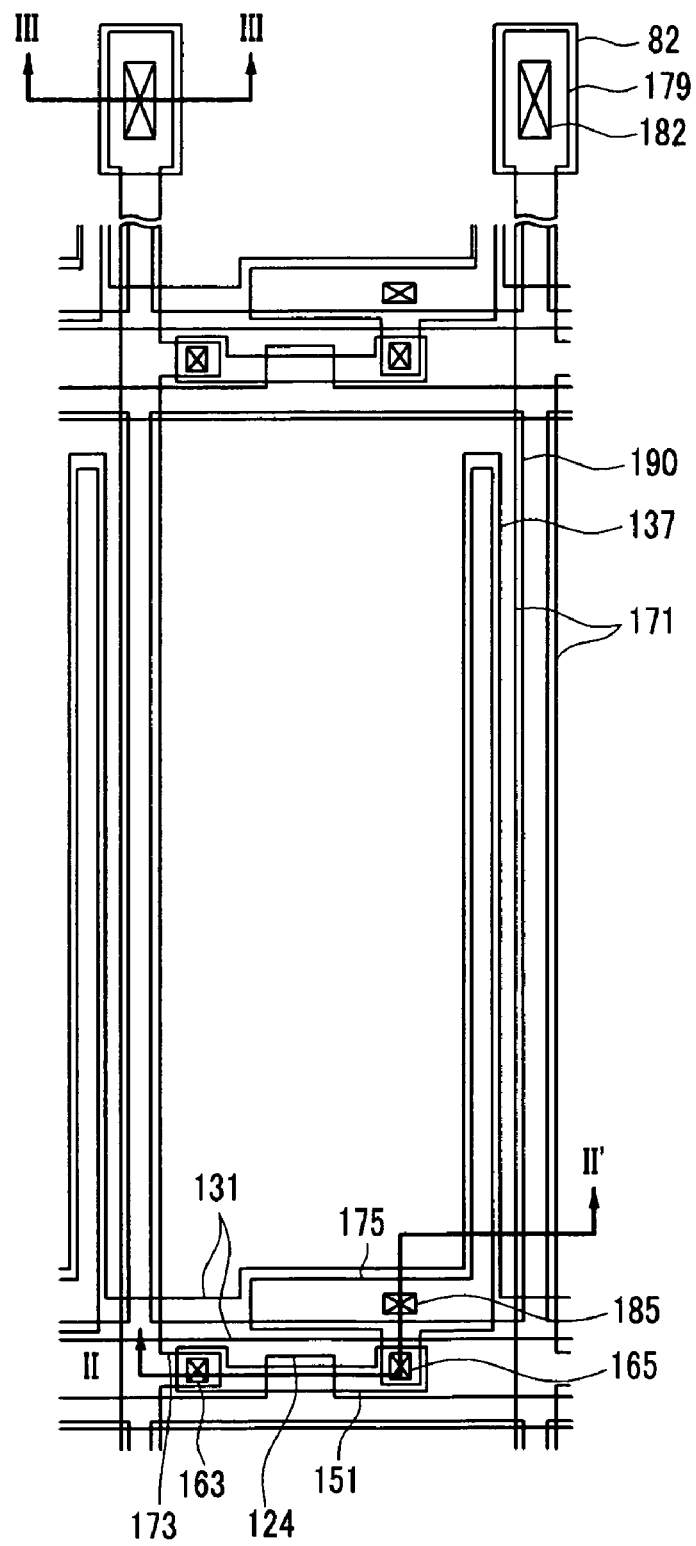
FIG. 2 shows a layout view of a thin film transistor (TFT) array panel for an LCD according to an embodiment of the present invention.
Figure 3:
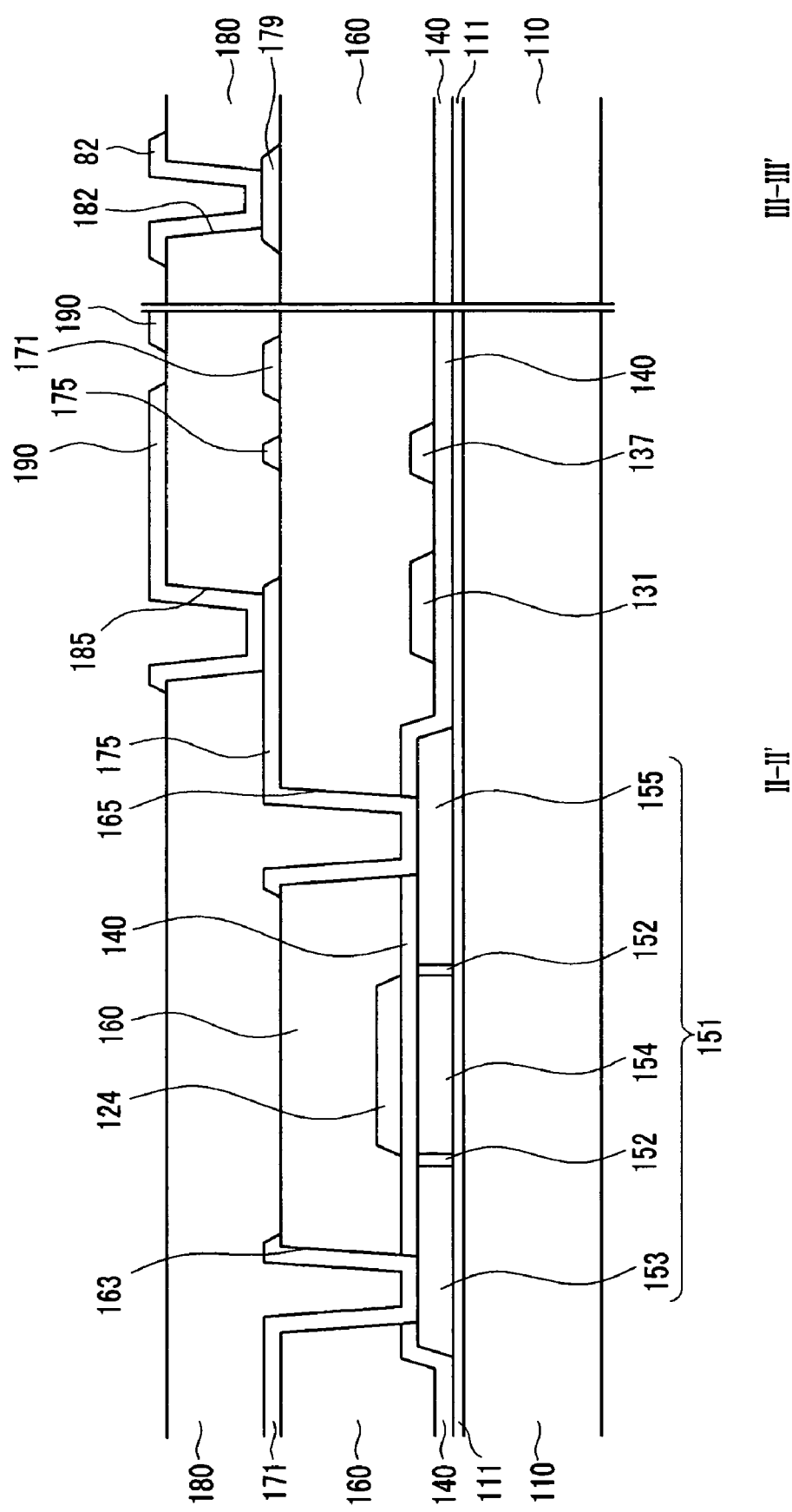
FIG. 3 is a cross-sectional view of the TFT array panel of FIG. 2 taken along the lines II-II' and III-III'.
Figure 4:
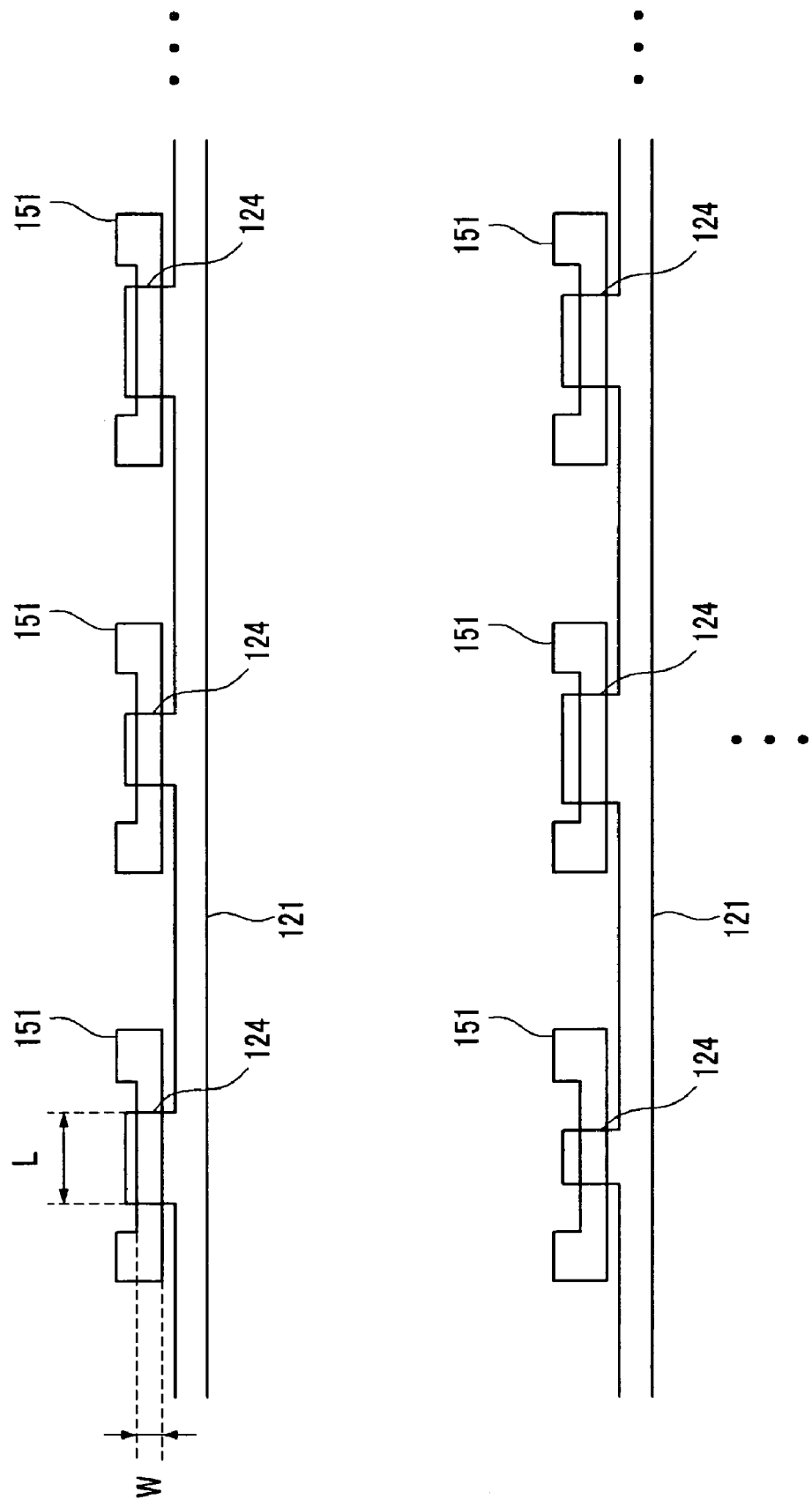
FIG. 4 shows a layout view illustrating the positional relationships between the gate electrodes and the semiconductors disposed in a plurality of pixels in the TFT array panel for the LCD of FIGS. 1 to 3 according to an embodiment of the present invention.

FIG. 1 shows a liquid crystal display (LCD) according to an embodiment of the present invention, FIG. 2 shows a layout view of a thin film transistor (TFT) array panel for an LCD according to an embodiment of the present invention, FIG. 3 is a cross-sectional view of the TFT array panel of FIG. 2 taken along the lines II-II' and III-III', FIG. 4 shows a layout view illustrating the positional relationships between the gate electrodes and the semiconductors disposed in a plurality of pixels in the TFT array panel for the LCD of FIGS. 1 to 3 according to an embodiment of the present invention.

A plurality of gate lines 121 transmitting scan signals and a plurality of data lines 171 transmitting image signals, which intersect each other to define a plurality of pixel areas P arranged in a matrix, are formed on a transparent insulating substrate 110.

In each pixel area P, a TFT Q connected to the gate lines 121 and the data lines 171, and a pixel electrode 190, electrically connected to the TFT Q, are provided. The TFT Q transmits the image signal to the pixel electrodes in response to the scan signals.

The plurality of pixel areas P forms a display area D displaying the image of the LCD. Here, end portions of the gate lines 121 and the data lines 171 are extended at the outside of the display area D, and approach each other in groups like a fan and then become parallel farther away from the display area D. Such an area outside of the display area D is referred to as a peripheral area.

The TFT array panel for the LCD according to embodiments of the present invention will now be described in detail with reference to FIGS. 2-4.

A blocking layer 111, preferably made of silicon oxide ($SiO_2$) or silicon nitride (SiNx), is formed on the transparent insulating substrate 110 which can be made of transparent glass, quartz, or sapphire. The blocking layer 111 may have a multi-layered structure.

A plurality of semiconductor islands 151, preferably made of polysilicon is formed on the blocking layer 111. Each of the semiconductor islands 151 includes two end portions, wider than other portions of the semiconductor islands 151, for connecting with other layers.

The plurality of semiconductor islands 151 in the pixel areas P have various widths W, and the semiconductor islands 151 having the various widths W are randomly distributed throughout the transparent insulating substrate 110. To form the plurality of semiconductor islands 151, an amorphous layer is crystallized by sequential lateral solidification (SLS) or excimer laser annealing (EAL), and then patterned. The crystallized states may be different depending on the positions.

Each of the semiconductor islands 151 includes a plurality of extrinsic regions containing N-type or P-type conductive impurities and at least one intrinsic region containing little of the conductive impurities. The extrinsic regions include highly doped regions and lightly doped regions.

The intrinsic regions include a channel region 154, a plurality of heavily doped regions such as source regions 153 and drain regions 155 separated from each other with respect to the channel region 154, and a plurality of lightly doped regions 152, referred to as "lightly doped drain (LDD) regions", disposed between the intrinsic regions 154 and the heavily doped source regions 153 and drain regions 155. Here, the number of heavily doped source regions 153 and drain regions 155 may vary, and the number of channel regions 154 may vary depending on the number of heavily doped source regions 153 and drain regions 155.

The LDD regions 152 have relatively small thicknesses and lengths compared with the heavily doped source regions 153 and drain regions 155, and are disposed close to the surfaces of the semiconductor islands 151.

The conductive impurities are either P-type or N-type. Boron (B) or gallium (Ga) may be used as the P-type and phosphorus (P) or arsenic (As) can be used as the N-type. The LDD regions 152 reduce leakage current and a "punch through", and may be substituted with offset regions that contain substantially no impurities.

A gate insulating layer 140 made of silicon oxide ($SiO_2$) or silicon nitride (SiNx) is formed with a thickness of about hundreds of angstroms on the semiconductor islands 151 and the blocking layer 111.

A plurality of gate conductors including a plurality of gate lines 121 and a plurality of storage electrode lines 131 are formed on the gate insulating layer 140.

The gate lines 121 for transmitting gate signals extend substantially in a transverse direction and include a plurality of gate electrodes 124 protruding downward to overlap the channel regions 154 of the semiconductor islands 151. Each gate line 121 may include an expanded end portion (not shown) having a large area for contact with another layer (not shown) or an external drive circuit (not shown). The gate lines 121 may be directly connected to a gate drive circuit (not shown) for generating the gate signals, which may be integrated on the transparent insulating substrate 110. The gate electrodes 124 may be expanded to overlap the LDD regions 152, and the width W of the gate electrodes 124 vary in each pixel, and are randomly distributed with the different widths W throughout the transparent insulating substrate 110.

The TFT Q includes the gate electrodes 124 as well as the channel regions 154, the source regions 153 and the drain regions 155 of the semiconductor islands 151, and the channel regions 154 are formed under the gate electrodes 124. Though the TFT Q turns off, leakage current flows. But, the amount of leakage current is different depending on the width W and length L of the channel region 154 of the TFT Q.

As shown in FIG. 4, the overlapping areas between the gate electrodes 124 and the semiconductor islands 151 vary and may make the TFTs Q have varying leakage currents, due to the different widths W and lengths L of the channel regions 154, and may make the TFTs Q be randomly distributed. In FIG. 4, both the widths W and lengths L of the channel regions 154 vary but either may vary to make the TFTs Q have varying leakage currents.

The storage electrode lines 131 are supplied with a predetermined voltage such as a common voltage, and include a plurality of storage electrodes 137 protruding to the neighboring gate lines 121, and are disposed between the two gate lines 121 neighboring each other.

The gate lines 121 and storage electrode lines 131 are preferably made of a low resistivity material including an Al-containing metal such as Al or an Al alloy (e.g. Al—Nd), an Ag-containing metal such as Ag or an Ag alloy, a Cu-containing metal such as Cu or a Cu alloy, a Mo-containing metal such as Mo or a Mo alloy, Cr, Ti, and Ta. The gate lines 121, storage electrode lines 131, and gate electrodes 124 may have a multi-layered structure including two films having different physical characteristics. One of the two films is preferably made of a low resistivity metal including an Al-containing metal, an Ag-containing metal, and a Cu-containing metal for reducing signal delay or voltage drop in the gate lines 121 and storage electrode lines 131. The other film is preferably made of a material such as Cr, Mo, a Mo alloy, Ta, or Ti, which have good physical, chemical, and electrical contact characteristics with other materials such as indium tin oxide (ITO) and indium zinc oxide (IZO). Good examples of the combination of the two films are a lower Cr film and an upper Al—Nd alloy film, and a lower Al film and an upper Mo film.

In addition, the lateral sides of the gate lines 121 and storage electrode lines 131 are inclined relative to the surface of the transparent insulating substrate 110 to enhance overlying adhesion characteristics.

An interlayer insulating layer 160 is formed on the gate lines 121 and storage electrode lines 131. The interlayer insulating layer 160 is preferably made of a photosensitive organic material having good flatness characteristics, a low dielectric insulating material having a dielectric constant lower by about 4.0, such as A-Si:C:O or A-Si:O:F, formed by plasma enhanced chemical vapor deposition (PECVD), or an inorganic material such as silicon nitride and silicon oxide. The interlayer insulating layer 160 has a plurality of contact holes 163 and 165 respectively exposing the source regions 153 and the drain regions 155.

A plurality of data lines 171 and a plurality of output electrodes 175 are formed on the interlayer insulating layer 160.

The data lines 171 for transmitting data voltages extend substantially in the longitudinal direction and intersect the gate lines 121. Each data line 171 includes a plurality of input electrodes 173 connected to the source regions 153 through the contact holes 163. Each data line 171 includes an expanded end portion 179 having a large area for contact with another layer (not shown) or an external drive circuit (not shown). The data lines 171 may be directly connected to a data drive circuit (not shown) for generating the gate signals, which may be integrated on the transparent insulating substrate 110. The storage electrodes 137 are disposed between the data lines 171 adjacent thereto.

The output electrodes 175 are separated from the input electrodes 173 and connected to the drain regions 155 through the contact holes 165, and overlap the storage electrode 137 to form a storage capacitor.

The data lines 171 and output electrodes 175 are preferably made of a refractory metal including Cr, Mo, Ti, and Ta, or alloys thereof. They may have a multi-layered structure preferably including a low resistivity film and a good contact film. A good example of the multi-layered structure includes a Mo lower film, an Al middle film, and a Mo upper film as well as the above-described combinations of a Cr lower film and an Al—Nd upper film and an Al lower film and a Mo upper film.

Like the gate lines 121 and the storage electrode lines 131, the data lines 171 and output electrodes 175 have tapered lateral sides relative to a surface of the transparent insulating substrate 110.

A passivation layer 180 is formed on the data lines 171, the output electrodes 175 and the interlayer insulating layer 160. The passivation layer 180 is preferably made of a photosensitive organic material having good flatness characteristics, a low dielectric insulating material having a dielectric constant lower by about 4.0, such as A-Si:C:O or A-Si:O:F formed by PECVD, or an inorganic material such as silicon nitride or silicon oxide.

The passivation layer 180 has a plurality of contact holes 185 and 182, exposing the output electrodes 175 and the expanded end portions 179 of the data lines 171, respectively. The passivation layer 180 and the interlayer insulating layer 160 may further have a plurality of contact holes (not shown) exposing end portions (not shown) of the gate lines 121.

A plurality of pixel electrodes 190 and a plurality of contact assistants 82, which are preferably made of a transparent conductor such as ITO or IZO or an opaque reflective conductor such as Al or Ag, are formed on the passivation layer 180.

The pixel electrodes 190 are physically and electrically connected to the output electrodes 175 through the contact holes 185 such that the pixel electrodes 190 receive the data voltages from the drain regions 155 via the output electrodes 175.

The contact assistants 82 are connected to the expanded end portions 179 of the data lines 171 through the contact holes 182. The contact assistants 82 protect the expanded end portions 179 of the data lines 171 and complement the adhesion of the expanded end portions 179 of the data lines 171 to external devices (not shown).

The pixel electrodes 190 supplied with the data voltages generate electric fields in cooperation with the common electrode (not shown) on an upper panel (not shown), which determine the orientations of the liquid crystal molecules of a liquid crystal layer (not shown).

As described above, the pixel voltages of the pixel electrodes 190 differ due to the varying leakage current of the TFTs Q such that the transmittance of the pixels are random. Accordingly, the TFTs Q having different leakage currents are randomly distributed such that the average transmittance of the pixels is uniform depending on their positions compared with the TFTs Q having the same leakage current. Therefore, stripes due to the leakage currents appear, thereby obtaining a more uniform display quality.

In the liquid display, a pixel electrode 190 and a common electrode (not shown) form a liquid crystal capacitor, which stores applied voltages after turning off the TFT Q. An additional storage capacitor (not shown), which is connected in parallel to the liquid crystal capacitor, can be provided for enhancing the voltage storing capacity. The storage capacitors are implemented by overlapping the pixel electrodes 190 with the storage electrodes 133 as well as the storage lines 131. The storage electrodes 133 may be omitted depending on the desired amount of storage capacitance.

The pixel electrodes 190 optionally overlap the gate lines 121 and the data lines 171 to increase the aperture ratio.

The above descriptions may be adapted to other flat panel display devices such as an OLED.

Figure 5:
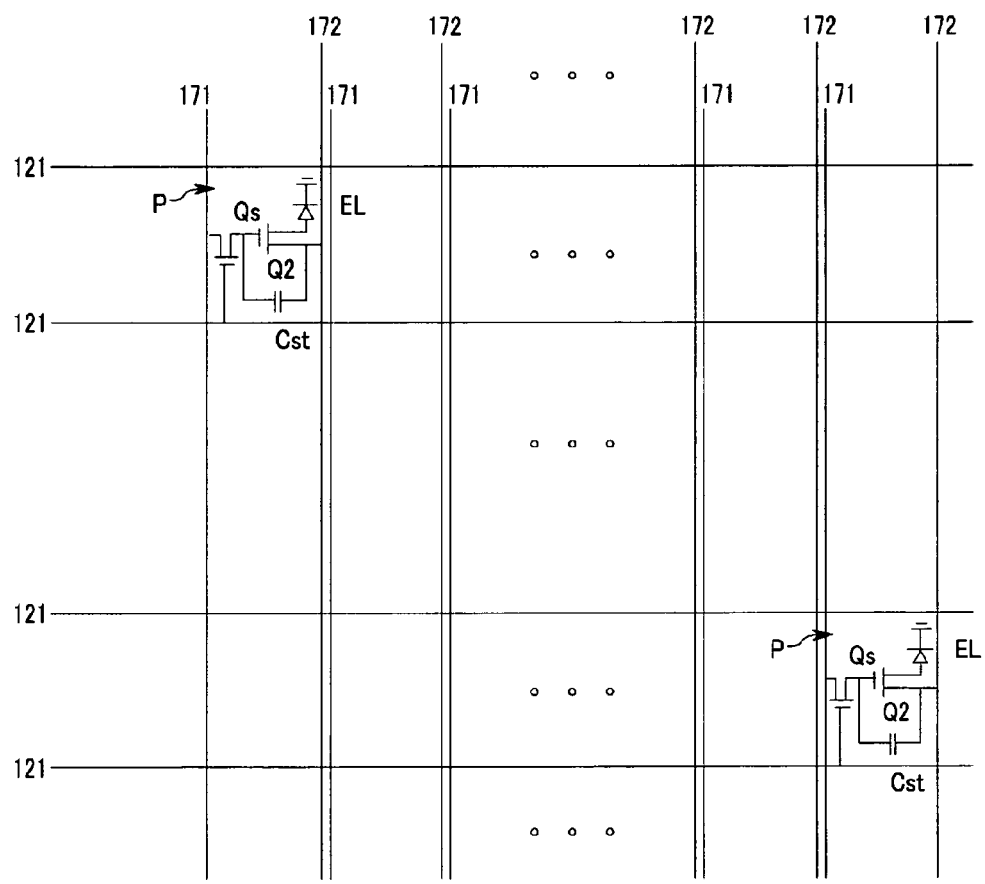
FIG. 5 shows an OLED according to an embodiment of the present invention.
Figure 6:
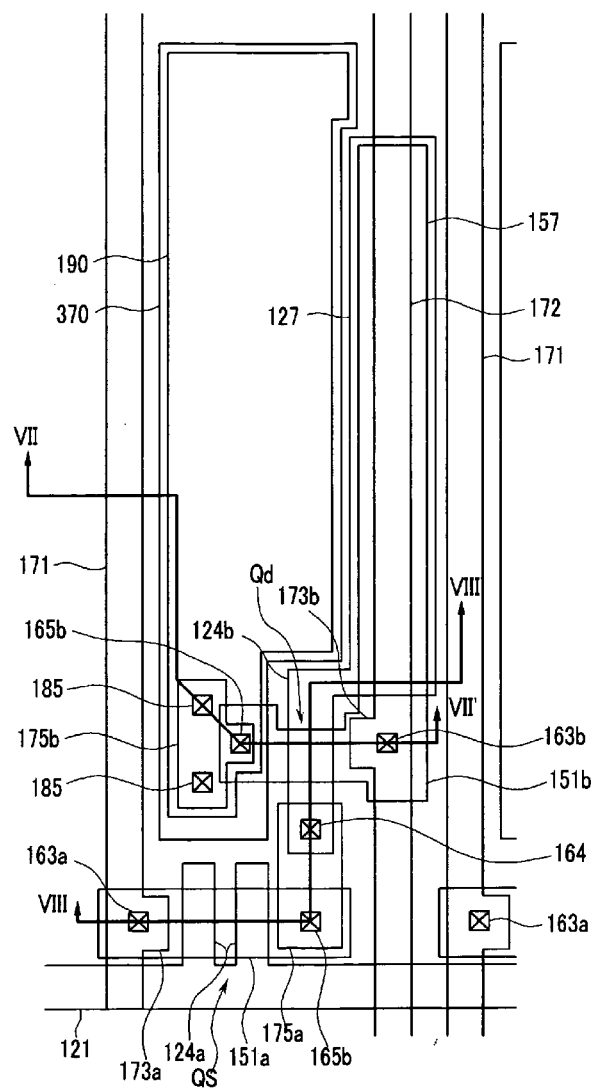
FIG. 6 shows a layout view of the TFT array panel for an OLED according to an embodiment of the present invention.
Figure 7:
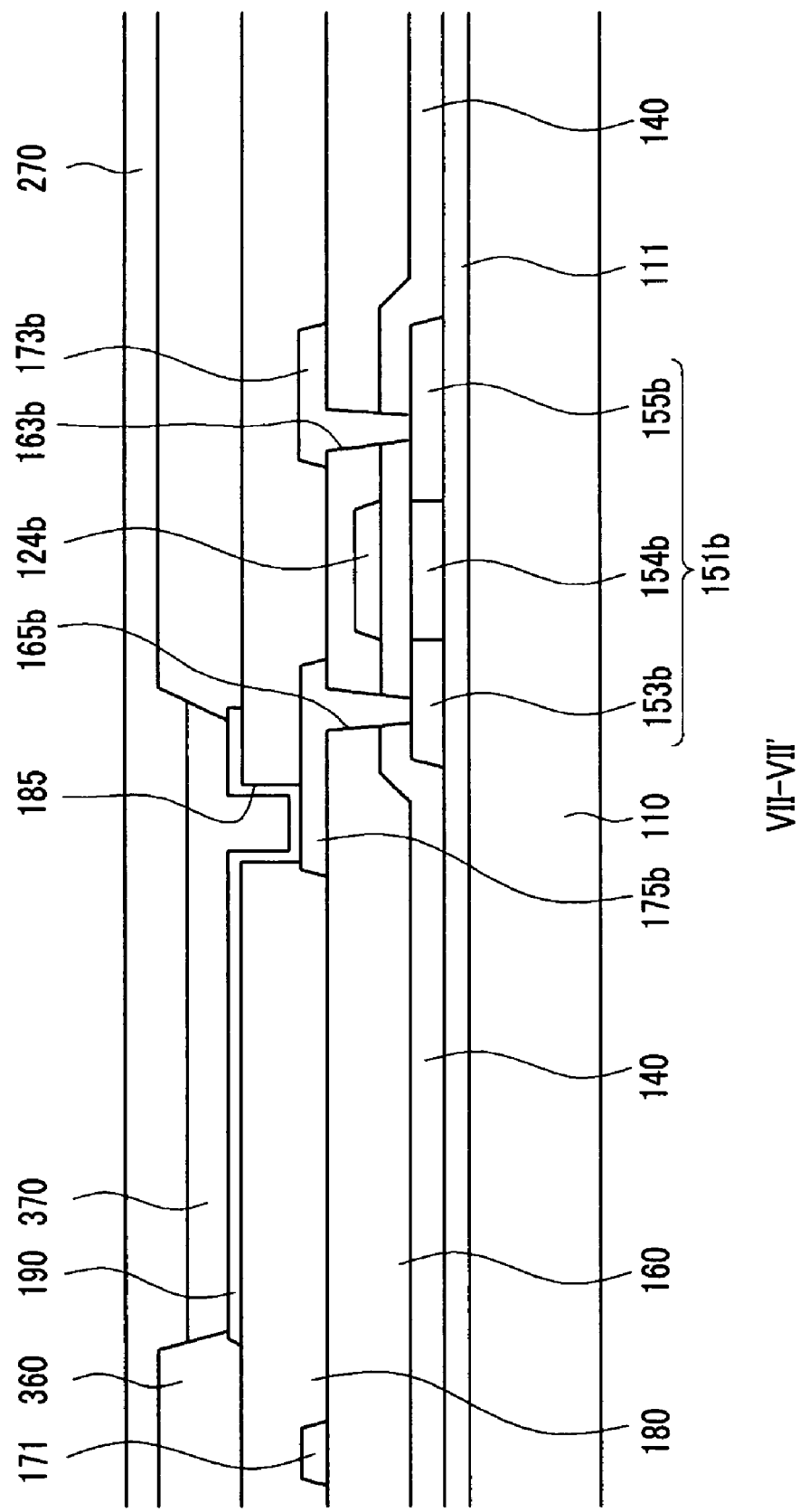
FIGS. 7 and 8 are cross-sectional views of the TFT array panel of FIG. 6 taken along the lines VII-VII' and VIII-VIII'.
Figure 8:
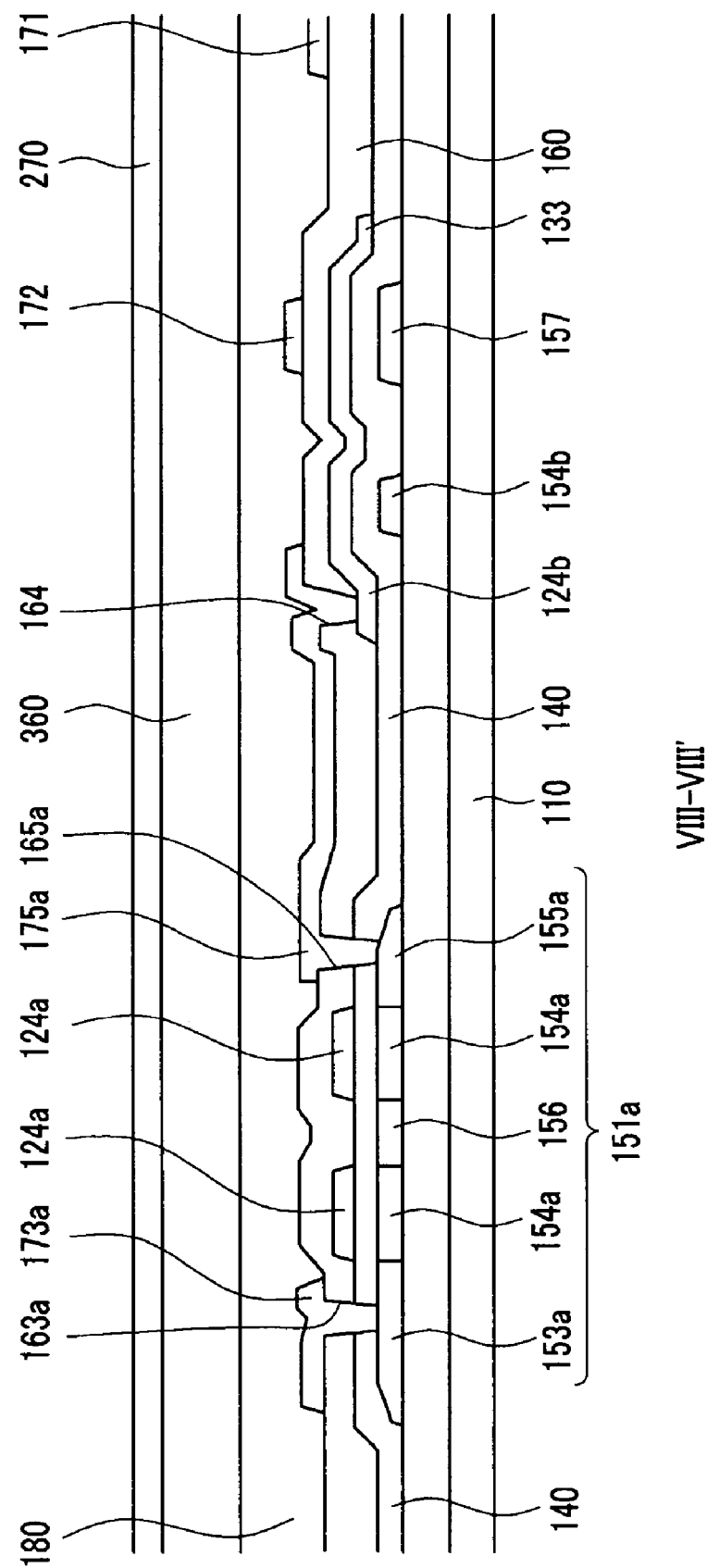
Figure 9:
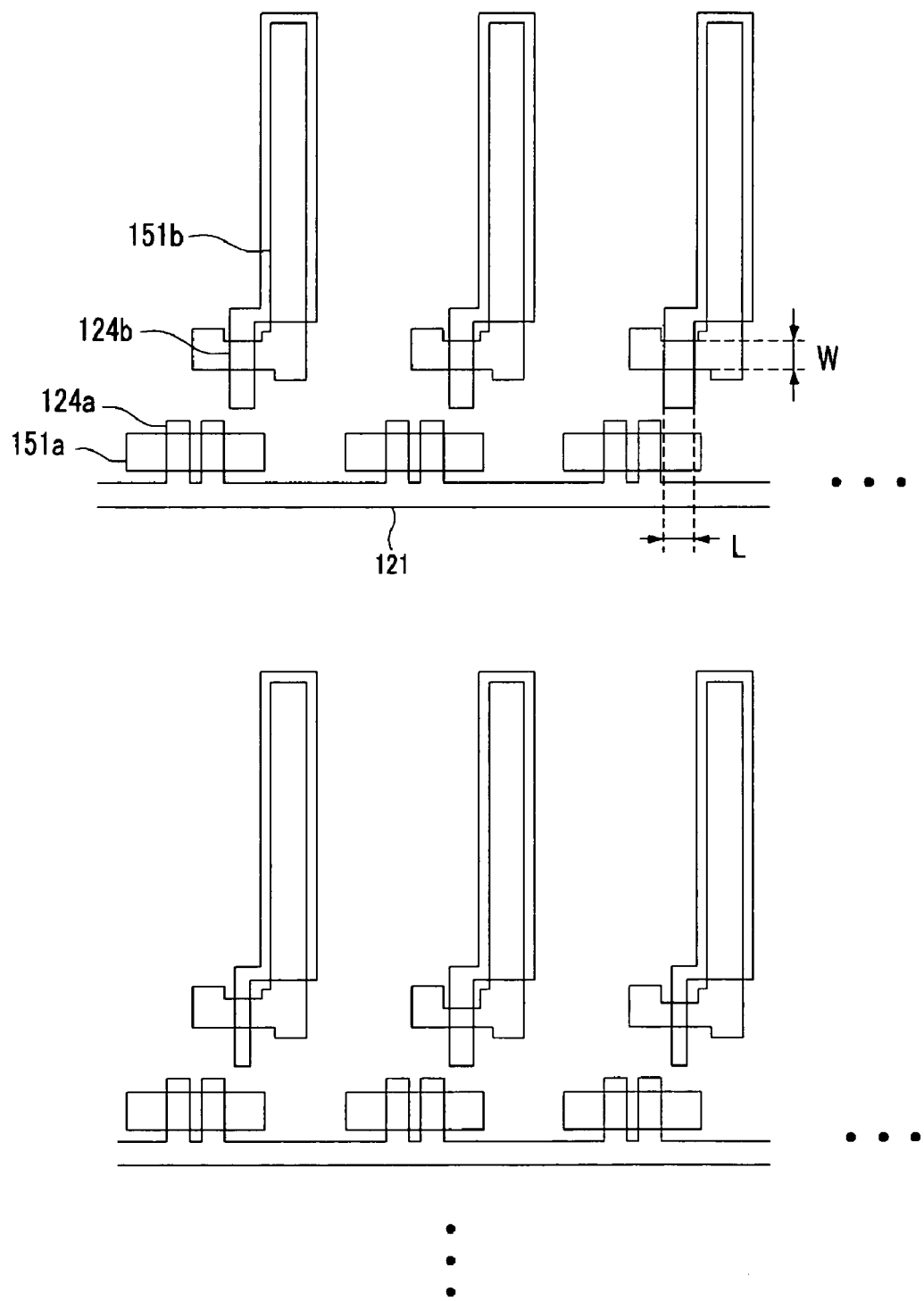
FIG. 9 shows a layout view illustrating the positional relationships between the gate electrodes and the semiconductors disposed in a plurality of pixels in the TFT array panel for the OLED of FIGS. 6 to 8 according to an embodiment of the present invention.

FIG. 5 shows an OLED according to an embodiment of the present invention, FIG. 6 shows a layout view of the TFT array panel for an OLED according to an embodiment of the present invention, FIGS. 7 and 8 are cross-sectional views of the TFT array panel of FIG. 6 taken along the lines VII-VII' and VIII-VIII' and FIG. 9 shows a layout view illustrating the positional relationships between the gate electrodes and the semiconductors disposed in a plurality of pixels in the TFT array panel for the OLED of FIGS. 6 to 8 according to an embodiment of the present invention.

Referring to FIG. 5, a plurality of gate lines 121 and a plurality of data lines 171, which intersect each other to define a plurality of pixel areas P arranged in a matrix, are formed on the transparent insulating substrate 110. In each pixel area P, a switching TFT $Q_s$ connected to a gate line 121 and a data line 171 and a pixel electrode (not shown) electrically connected to the switching TFT $Q_s$ are provided.

In the OLED display, the switching TFTs $Q_s$ transmit image signals transmitted through the data lines 171 to drive TFTs $Q_d$ in response to gate signals transmitted through the gate lines 121. The drive TFTs $Q_d$ are activated by the image signals and thus currents transmitted through power supply voltage electrodes 171 flow to a common electrode (not shown) provided with an opposite panel via the pixel electrodes and organic emitting layers EL. Each of the power supply voltage electrodes 171 is connected to a constant voltage source.

The organic emitting layer EL emits light belonging to a certain range of wavelength when current flows therethrough. The amount of light emitted from the organic emitting layer EL varies depending on the amount of current flowing therethrough, and thus the luminance thereof varies. The amount of current possible to flow through the drive TFTs $Q_d$ is determined by the magnitude of the image signal voltage transmitted via the switching TFTs $Q_s$.

Now, the TFT array panel for the OLED display according to embodiments of the present invention will be described in detail with reference to FIGS. 6-9.

A blocking layer 111 preferably made of silicon oxide or silicon nitride is formed on a transparent insulating substrate 110 preferably made of transparent glass. The blocking layer 111 may have a dual-layered structure.

A plurality of first and second semiconductor islands 151a and 151b preferably made of polysilicon is formed on the blocking layer 111. Each of the first and second semiconductor islands 151a and 151b includes a plurality of extrinsic regions containing N type or P type conductive impurities and at least one intrinsic region containing little or no conductive impurity.

Regarding the first semiconductor island 151a for a switching TFT $Q_s$, the extrinsic regions include a first source region 153a, an intermediate region 156, and a first drain region 155a, which are doped with N type impurity and separated from one another, and the intrinsic regions include a pair of first channel regions 154a disposed between the extrinsic first source region 153a, intermediate region 156 and first drain region 155a. Here, the number of heavily doped first source regions 153a and first drain regions 155a may vary, and the number of pairs of first channel regions 154a may vary depending on the number of heavily doped first source regions 153a and first drain regions 155a.

Concerning the second semiconductor island 151b for a drive TFT $Q_d$, the extrinsic regions include a second source region 153b and a second drain region 155b, which are doped with P type impurity and separated from one another, and the intrinsic region includes a second channel region 154b disposed between the second source region 153b and the second drain region 155b. The second source region 153b extends to form a storage region 157.

The extrinsic regions may further include lightly doped regions (not shown) disposed between the pairs of first channel regions 154a, the second channel regions 154b, the first and second source regions 153a and 153b and the first and second drain regions 155a and 155b. The lightly doped regions may be substituted with offset regions that contain substantially no impurity.

Referring to FIG. 9, the plurality of second semiconductor islands 151b for the drive TFTs $Q_d$ have various widths W, and the second semiconductor islands 151b having the various widths W are randomly distributed throughout the transparent insulating substrate 110. At this time, to form the plurality of second semiconductor islands 151b, an amorphous layer is crystallized by SLS or ELA, and patterned, and the crystallized states may be different depend on the positions. The plurality of first semiconductor islands 151a for the switching TFTs $Q_s$ may have various widths W and the first semiconductor islands 151a having the various widths W may be randomly distributed throughout the transparent insulating substrate 110.

Alternatively, the extrinsic first source regions 153a and first drain regions 155a of the semiconductor islands 151a are doped with P type impurity, while the extrinsic second source regions 153b and second drain regions 155b of the semiconductor islands 151b are doped with N type impurity, depending on drive conditions. The conductive impurity includes P type impurity such as boron (B) or gallium (Ga) and N type impurity such as phosphorous (P) or arsenic (As). The semiconductor islands 151a and 151b may be doped with the same impurity.

The semiconductor islands 151a and 151b may be made of amorphous silicon. In this case, there are no impurity regions and ohmic contacts for improving contact characteristics between semiconductor islands 151a and 151b and other metal layers may be formed on the semiconductor islands 151a and 151b.

A gate insulating layer 140 preferably made of silicon oxide or silicon nitride is formed on the semiconductor islands 151a and 151b and the blocking layer 111.

A plurality of gate lines 121, a plurality of pairs of first gate electrodes 124a and a plurality of second gate electrodes 124b are formed on the gate insulating layer 140.

The gate lines 121 for transmitting gate signals extend substantially in a transverse direction. Each pair of first gate electrodes 124a protrude upward from the gate line 121 and they intersect the first semiconductor islands 151a such that they overlap the pair of first channel regions 154a1 and 154a2. Each gate line 121 may include an expanded end portion having a large area for contact with another layer or an external drive circuit. The gate lines 121 may be directly connected to a gate drive circuit for generating the gate signals, which may be integrated on the transparent insulating substrate 110. The size of the pairs of first gate electrodes 124a may vary, and the pairs of first gate electrodes 124a having varying sizes may be randomly distributed.

The second gate electrodes 124b are separated from the gate lines 121 and intersect the second semiconductor islands 151b such that they overlap the second channel regions 154b. The second gate electrodes 124b extend to form storage electrodes 127 overlapping the storage electrode regions 157 of the second semiconductor islands 151b to form storage capacitors Cst (shown FIG. 5). Though the drive TFT $Q_d$ turns off, leakage current flows. The amount of leakage current is different depending on the widths W and lengths L of the pairs of first channel regions 154a and the second channel regions 154b of the drive TFT Qd.

As shown in FIG. 9, the overlapping areas between the second gate electrodes 124b and the second semiconductor islands 151b vary, and this may make the drive and switching TFTs $Q_d$ and $Q_s$ have varying leakage currents due to the different widths W and lengths L of the pairs of first channel regions 154a and second channel regions 154b, and to be randomly distributed.

In FIG. 9, both the widths W and lengths L of the channel regions vary, but one or both may vary to make the drive and switching TFTs $Q_d$ and $Q_s$ have varying leakage currents. Furthermore, the widths W of the pairs of first gate electrodes 124a may vary for forming varying leakage currents of the switching TFTs $Q_s$.

The gate lines 121, the pairs of first gate electrodes 124a and the second gate electrodes 124b are preferably made of low resistivity material including Al containing metal such as Al and Al alloy (e.g. Al—Nd), Ag containing metal such as Ag and Ag alloy, and Cu containing metal such as Cu and Cu alloy. The gate lines 121, the pairs of first gate electrodes 124a and the second gate electrodes 124b may have a multi-layered structure including two films having different physical characteristics. One of the two films is preferably made of low resistivity metal including Al containing metal, Ag containing metal, and Cu containing metal for reducing signal delay or voltage drop in the gate lines 121, the pairs of first gate electrodes 124a and the second gate electrodes 124b. The other film is preferably made of material such as Cr, Mo and Mo alloy, Ta or Ti, which has good physical, chemical, and electrical contact characteristics with other materials such as indium tin oxide (ITO) or indium zinc oxide (IZO). Good examples of the combination of the two films are a lower Cr film and an upper Al—Nd alloy film and a lower Al film and an upper Mo film.

In addition, the lateral sides of the gate lines 121, the pairs of first gate electrodes 124a and the second gate electrodes 124b are inclined relative to a surface of the transparent insulating substrate 110, and the inclination angle thereof ranges about 30-80 degrees.

An interlayer insulating film 160 is formed on the gate lines 121, the pairs of first gate electrodes 124a and the second gate electrodes 124b. The interlayer insulating layer 160 is preferably made of photosensitive organic material having good flatness characteristics, low dielectric insulating material having a dielectric constant lower by about 4.0, such as A-Si: C:O or A-Si:O:F, formed by plasma enhanced chemical vapor deposition (PECVD), or inorganic material such as silicon nitride and silicon oxide.

The interlayer insulating layer 160 has a plurality of contact holes 164 exposing the second gate electrodes 124b. In addition, the interlayer insulating layer 160 and the gate insulating layer 140 have a plurality of contact holes 163a, 163b, 165a and 165b exposing the source regions 153a and 153b and the drain regions 155a and 155b, respectively.

A plurality of data conductors including a plurality of data lines 171, a plurality of drive voltage lines 172, and a plurality of first and second drain electrodes 175a and 175b are formed on the interlayer insulating film 160.

The data lines 171 for transmitting data signals extend substantially in the longitudinal direction and intersect the gate lines 121. Each data line 171 includes a plurality of first source electrodes 173a connected to the first source regions 153a through the contact holes 163a. Each data line 171 may include an expanded end portion 179 having a large area for contact with another layer or an external drive circuit. The data lines 171 may be directly connected to a data drive circuit for generating the gate signals, which may be integrated on the transparent insulating substrate 110.

The drive voltage lines 172 for transmitting drive voltages for the drive TFT $Q_d$ extend substantially in the longitudinal direction and intersect the gate lines 121. Each drive voltage line 172 includes a plurality of second source electrodes 173b connected to the second source regions 153b through the contact holes 163b. The drive voltage line 172 overlaps the storage electrode 127, and they may be connected to each other.

The first drain electrodes 175a are separated from the data lines 171 and the drive voltage lines 172 and connected to the first drain regions 155a through the contact holes 165a and to the second gate electrodes 124b through the contact hole 164.

The second drain electrodes 175b are separated from the data lines 171 and the drive voltage lines 172 and connected to the second drain regions 155b through the contact holes 165b.

The data lines 171, drive voltage lines 172, and first and second drain electrodes 175a and 175b are preferably made of refractory metal including Cr, Mo, Ti, Ta or alloys thereof. They may have a multi-layered structure preferably including a low resistivity film and a good contact film. Good examples of the multi-layered structure are a double-layered structure including a lower Cr film and an upper Al (alloy) film, a double-layered structure of a lower Mo (alloy) film and an upper Al (alloy) film, and a triple-layered of a lower Mo film, an intermediate Al film, and an upper Mo film.

Like the gate lines 121, the pairs of first gate electrodes 124a and the second gate electrodes 124b, the data lines 171, drive voltage lines 172, and first and second drain electrodes 175a and 175b have inclined edge profiles, and the inclination angles thereof range about 30-80 degrees.

A passivation layer 180 is formed on the data lines 171, drive voltage lines 172, and first and second drain electrodes 175a and 175b. The passivation layer 180 is also preferably made of organic material, low dielectric insulating material, or inorganic material.

The passivation layer 180 has a plurality of contact holes 185 exposing the second drain electrodes 175b. The passivation layer 180 may further has a plurality of contact holes (not shown) exposing expanded end portions 179 of the data lines 171 and the passivation layer 180 and the interlayer insulating layer 160 may have a plurality of contact holes (not shown) exposing end portions of the gate lines 121.

A plurality of pixel electrodes 190 is formed on the passivation layer 180.

The pixel electrodes 190 serve as anodes of light emitting elements and they are connected to the second drain electrodes 175b through the contact holes 185. The pixel electrodes 190 are preferably made of transparent conductor such as ITO or IZO. However, the pixel electrode 190 may be made of opaque reflective conductor such as Al, Ag, Ca, Ba and Mg.

A plurality of contact assistants 82 or connecting members (not shown) may also be formed on the passivation layer 180 such that they are connected to the exposed end portions of the gate lines 121, the data lines 171, or a common voltage pad (not shown).

A partition 360 for separating pixels of the OLED is formed on the passivation layer 180 and the pixel electrodes 190. The partition 360 surrounds the pixel electrodes 190 to define openings to be filled with organic light emitting material. The partition 360 is preferably made of organic or inorganic insulating material. The partition 360 is preferably made of photosensitivity organic including black resin. This partition 360 may play a role to a light blocking member and the manufacturing process may be simplified.

A plurality of light emitting members 370 are formed on the pixel electrodes 190 and disposed in the openings defined by the partition 360. The light emitting members 370 are preferably made of organic material emitting primary-color lights such as red, green and blue lights. The red, green and blue light emitting members 370 are periodically arranged.

A common electrode 270 is formed on the light emitting members the partition 360. The common electrode 270 is supplied with a common voltage Vcom.

The common electrode 270 is preferably made of reflective material such as Ba, Ca, Ma, Al, Ag, or their alloys, or transparent material such as ITO and IZO.

In the above-described OLED, a first semiconductor island 151a, a pair of first gate electrodes 124a connected to the gate line 121, a first source electrode 153a connected to the data line 171, and a first drain electrode 155a form a switching TFT Qs. In addition, a second semiconductor island 151b, a second gate electrode 124b connected to the first drain electrode 155a, a second source electrode 153b connected to the drive voltage line 172, and a second drain electrode 155b connected to a pixel electrode 190 form a drive TFT Qd. Furthermore, a storage region 157 connected to a first drain region 155a and a storage electrode 127 connected to a drive voltage line 172 through a second source electrode 153b form a storage capacitor Cst. The TFTs Qs and Qd shown in FIGS. 6-9 are referred to as "top gate TFTs" since the pairs of first gate electrodes 124a and the second gate electrodes 124b are disposed on the semiconductor islands 151a and 151b.

The switching TFT Qs transmits data signals from the data line 171 in response to a gate signal from the gate line 121. The drive TFT $Q_d$ drives a current having a magnitude depending on the voltage difference between the second gate electrode 124b and the second drain electrode 175b upon receipt of the data signals. The voltage difference between the second gate electrode 124b and the second source electrode 173b is stored in the storage capacitor Cst and maintained after the switching TFT Qs turns off. The light emitting diode emits light having intensity depending on the current driven by the drive TFT $Q_d$ and the monochromatic primary color lights emitted from the light emitting diodes are spatially added to display images.

The intensity of the light emitting members 370 is changed depending on the current driven by the drive TFTs $Q_d$. The leakage currents of the drive TFTs $Q_d$ differ and the drive TFTs $Q_d$ having different leakage currents are randomly distributed such that the amount of current applied to the pixel electrodes 190 is varied and randomly distributed, and the intensity of the light emitting members 370 is varied and randomly changed. Accordingly, if the drive TFTs $Q_d$ having the different leakage currents are randomly distributed, the average intensity of the light emitting members 370 is uniform depending on the positions, thereby yielding an OLED display having uniform display quality without stripes.

The leakage current of the switching TFT Qs may vary and the switching TFT Qs may be randomly distributed to yield uniform display quality without stripes.

The overlapping areas between the gate electrodes and the semiconductor islands 151 are changed to form the varying leakage current, but the below method may be provided to form the varying leakage current.

Figure 10:
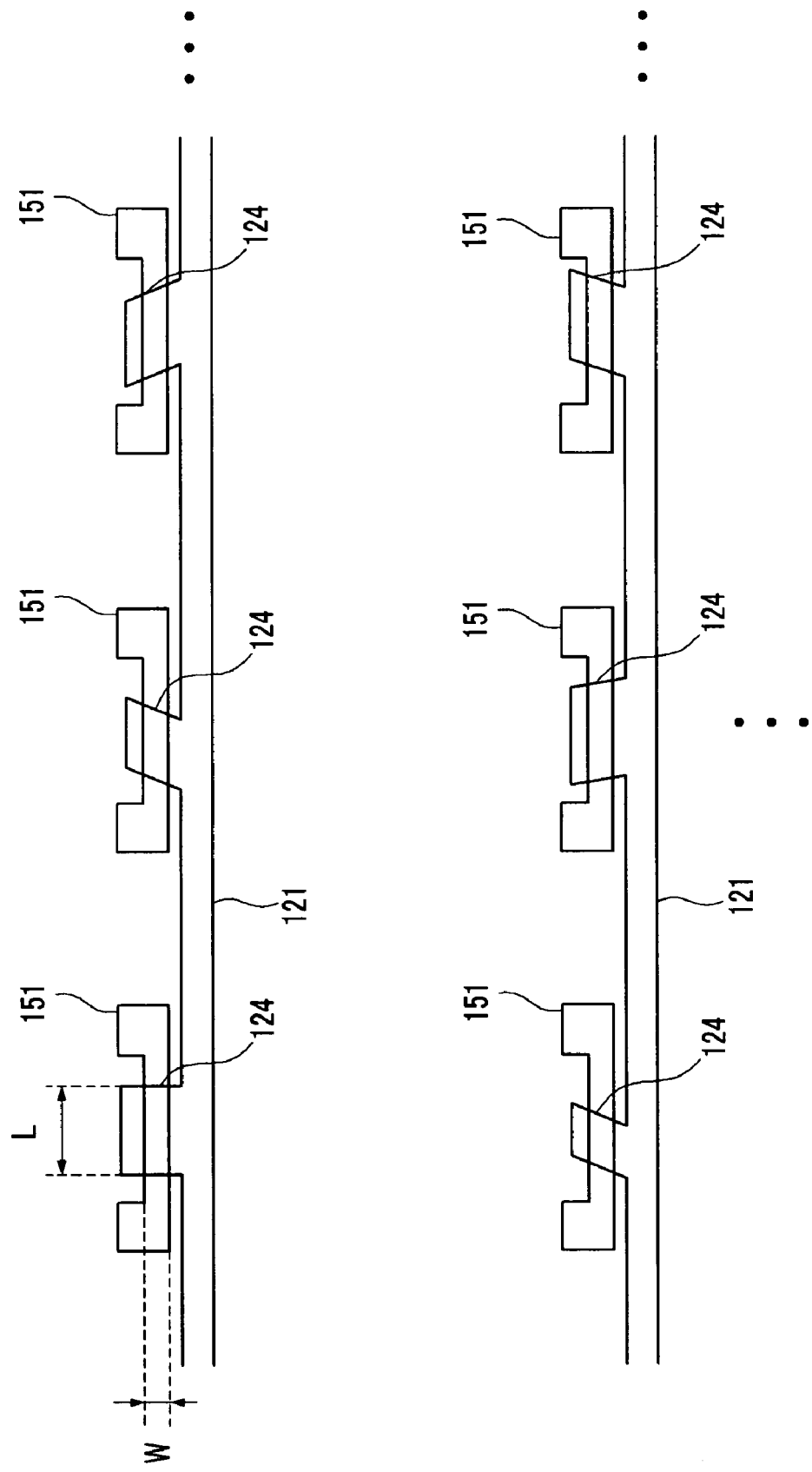
FIG. 10 shows a layout view illustrating the positional relationships between the gate electrodes and the semiconductors disposed in a plurality of pixels in the TFT array panel for the LCD according to another embodiment of the present invention.
Figure 11:
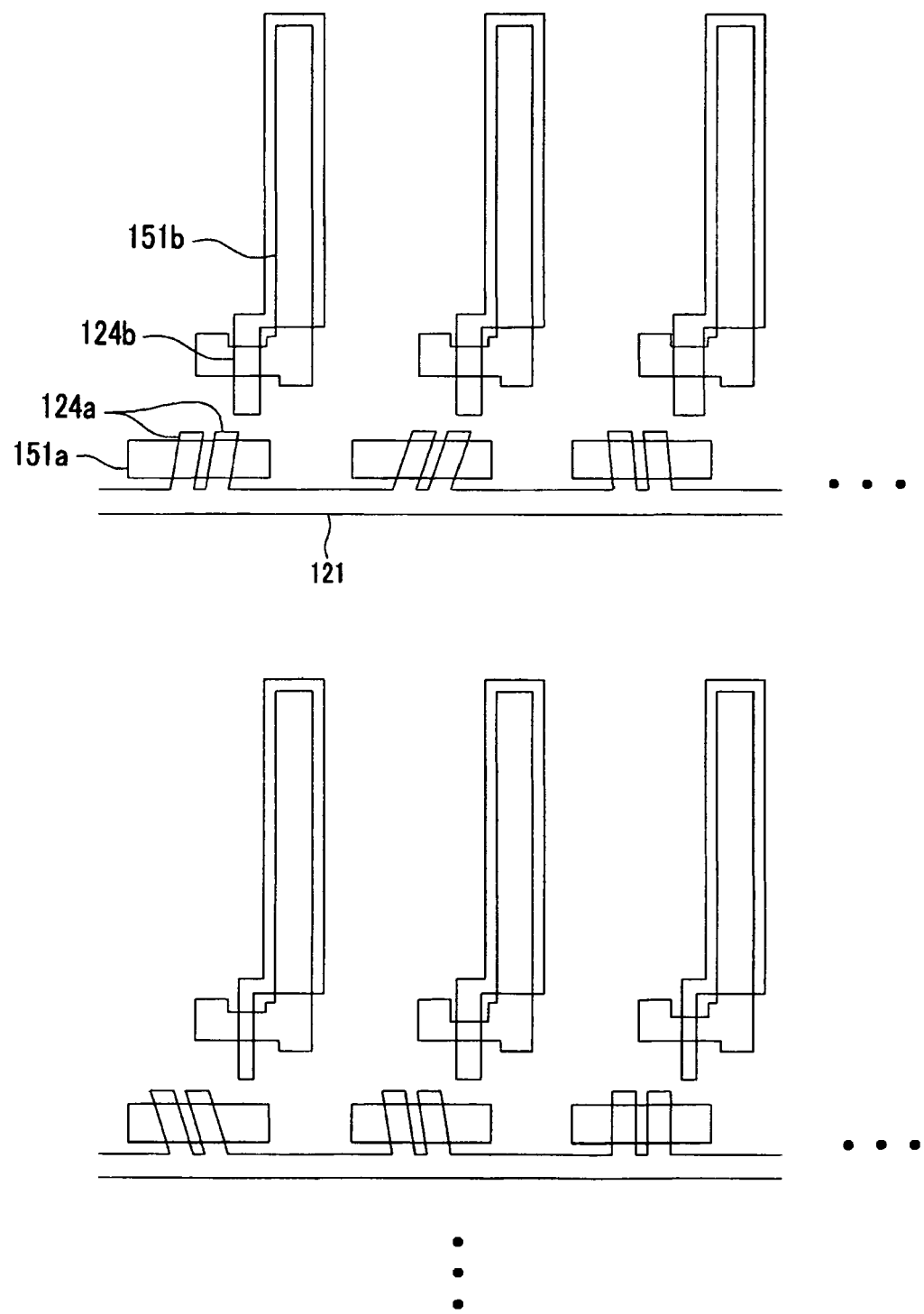
FIG. 11 shows a layout view illustrating the positional relationships between the gate electrodes and the semiconductors disposed in a plurality of pixels in the TFT array panel for the OLED according to another embodiment of the present invention.

FIG. 10 shows a layout view illustrating the positional relationships between the gate electrodes and the semiconductor islands disposed in a plurality of pixels in the TFT array panel for the LCD according to another embodiment of the present invention, and FIG. 11 shows a layout view illustrating the positional relationships between the gate electrodes and the semiconductors disposed in a plurality of pixels in the TFT array panel for the OLED according to another embodiment of the present invention.

The layered structures of the TFT panels according to theses embodiments are almost the same as that shown in FIGS. 1 to 9, respectively. But, the positional relationships between the gate electrodes and the semiconductor islands disposed in a plurality of pixels in the TFT array panel are showed in FIGS. 10 and 11.

As shown in FIGS. 10 and 11, a plurality of semiconductor islands 151 and first and second semiconductor islands 151a and 151b have the same sizes in each pixel, different from the above described embodiment.

Furthermore, a plurality of gate electrodes 124, pairs of first gate electrodes 124a, and second gate electrodes 124b are declined (downwardly sloped) with respect to a plurality of gate lines 121, and overlap a plurality of semiconductor islands 151, first semiconductor islands 151a, and second semiconductor islands 151b, respectively. In FIG. 11, all of the pairs of first gate electrodes 124a for the switching TFTs $Q_s$ are declined, but a plurality of second gate electrodes 124b for the drive TFTs Qd may optionally be declined.

Each gate electrode 124, pair of first gate electrodes 124a, and second gate electrode 124b have a different declination and a different width W overlapping the semiconductor islands 151, first semiconductor island 151a and second semiconductor island 151b, respectively.

In this way, if the declinations of the gate electrodes 124, pairs of first gate electrodes 124a, and second gate electrode 124b are changed, the widths W and the lengths L of the channel regions of the TFTs vary. Accordingly, the TFTs with varying leakage currents are randomly distributed, thereby obtaining uniform display quality without the influence of the crystallized state of the semiconductor.

The TFTs having varying leakage currents are randomly distributed throughout the entire display panel, thereby obtaining a display panel having uniform and high quality display characteristics without stripes.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A thin film transistor (TFT) array panel comprising:
a substrate;
a plurality of gate lines including gate electrodes;
a plurality of data lines intersecting the gate lines;
a plurality of TFTs having semiconductor islands connected to the gate lines and the data lines; and
a plurality of pixel electrodes connected to the TFTs,
wherein the gate electrodes are slanted with respect to the gate lines in a plane view and overlap the semiconductor islands in varying slant directions in the plane view to make the TFTs have varying leakage currents, and the TFTs are randomly distributed.

2. The TFT array panel of claim 1, wherein the semiconductor islands and the gate electrodes overlap each other with varying overlapping areas to form the varying leakage currents.

3. The TFT array panel of claim 1, further comprising:
a blocking layer formed between the substrate and the semiconductor islands.

4. The TFT array panel of claim 1, further comprising:
a passivation layer formed between the pixel electrodes and the gate and data lines.

5. The TFT array panel of claim 1, further comprising:
an interlayer insulating layer formed between the gate lines and the data lines.

6. The TFT array panel of claim 1, further comprising:
a partition formed on the pixel electrodes, and
a plurality of light emitting members formed on the pixel electrodes and disposed in openings defined by the partition.

7. A thin film transistor (TFT) array panel comprising:
a substrate;
a plurality of gate lines including gate electrodes;
a plurality of data lines intersecting the gate lines;
a plurality of TFTs connected to the gate lines and the data lines; and
a plurality of pixel electrodes connected to the TFTs,
wherein at least two of the gate electrodes of a gate line are slanted in varying slant directions, and wherein each of the slanted gate electrodes is slanted with respect to an extending direction of part of the gate line from which the slanted gate electrode protrudes in a plane view.

8. The TFT array panel of claim 7, further comprising:
a passivation layer formed between the pixel electrodes and the gate and data lines.

9. The TFT array panel of claim 7, further comprising:
an interlayer insulating layer formed between the gate lines and the data lines.

10. The TFT array panel of claim 7, further comprising:
a partition formed on the pixel electrodes, and
a plurality of light emitting members formed on the pixel electrodes and disposed in openings defined by the partition.

11. The TFT array panel of claim 7, wherein the TFT comprises a semiconductor island, and the gate electrode overlaps a respective semiconductor island.

12. The TFT array panel of claim 11, further comprising:
a blocking layer formed between the substrate and the semiconductor islands.

* * * * *